Figure 1:
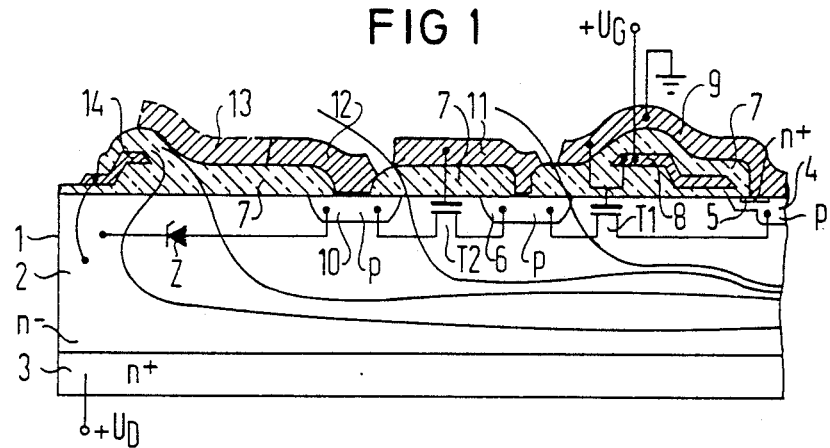

United States Patent [19]

Fellinger et al.

[11] Patent Number: 4,633,292

[45] Date of Patent: Dec. 30, 1986

[54] SEMICONDUCTOR COMPONENT WITH PLANAR STRUCTURE

[75] Inventors: Christine Fellinger; Ludwig Leipold; Jenö Tihanyi, all of Munich, Fed. Rep. of Germany

[73] Assignee: Siemens Aktiengesellschaft, Berlin and Munich, Fed. Rep. of Germany

[21] Appl. No.: 828,575

[22] Filed: Feb. 10, 1986

Related U.S. Application Data

[63] Continuation of Ser. No. 498,015, May 25, 1983.

[30] Foreign Application Priority Data

May 28, 1982 [DE] Fed. Rep. of Germany ....... 3220250

[51] Int. Cl.$^4$ ............................................. H01L 29/40
[52] U.S. Cl. ..................................... 357/53; 357/23.4; 357/52
[58] Field of Search ..................... 357/23.3, 23.1, 23.4, 357/23.8, 52, 53

[56] References Cited

U.S. PATENT DOCUMENTS

| 3,573,571 | 4/1971 | Brown et al. ...................... 357/53 X |
| 3,763,406 | 10/1973 | Bosselaar ............................... 357/53 |
| 4,468,686 | 8/1984 | Rosenthal ....................... 357/53 OR |
| 4,567,502 | 1/1986 | Nakagawa et al. ................ 357/52 X |

FOREIGN PATENT DOCUMENTS

| 3012430 | 10/1981 | Fed. Rep. of Germany . |
| 0065682 | 5/1977 | Japan ..................................... 357/53 |

OTHER PUBLICATIONS

"SIPMOS Technology, an Example of VLSI Precision Realized with Standard LSI for Power Transistors", G. Bell & W. Ladenhauf, Siemens Forsch.-U. Entwickl.--Ber. Bd. 9(1984) 190-194.

Primary Examiner—Martin H. Edlow
Assistant Examiner—Sara W. Crane
Attorney, Agent, or Firm—Herbert L. Lerner; Laurence A. Greenberg

[57] ABSTRACT

Planar semiconductor component which has a substrate of one conduction type, and a contact-connected zone of opposite conductivity type embedded in the surface of the substrate in planar fashion and having a part thereof emerging to the surface. It also has a control electrode covering that part of the contact-connected contacted zone which emerges to the surface, an insulating layer on the surface, an edge electrode seated on the insulating layer at the edge of the substrate and electrically connected to the substrate, and at least one protective ring zone of the opposite conductivity type positioned between the edge of the substrate and the contact-connected zone and embedded in planar fashion in the surface. The ring zone includes at least one conducting layer completely covering a part of the substrate emerging to the surface between the protective ring zone and the contacted zone, wherein the conducting layer is electrically insulated from the emerging part of the substrate, and electrically contacted by one of the contact-connected protective ring zones embedded in planar fashion in the substrate surface.

10 Claims, 3 Drawing Figures

SEMICONDUCTOR COMPONENT WITH PLANAR STRUCTURE

This application is a continuation of application Ser. No. 498,015, filed May 25, 1983.

The invention relates to a planar semiconductor component having a substrate of one conduction type, a contacted zone of opposite conduction type embedded in the surface of the substrate and having a part thereof emerging to the surface, a control electrode covering the part of the contacted zone emerging to the surface, an insulating layer on the surface, an edge electrode seated on the insulating layer at the edge of the substrate and electrically connected to the substrate, and at least one protective ring of the opposite conduction type disposed between the edge of the substrate and the contacted zone and embedded planar in the surface.

In German Published Non-Prosecuted Application (DE-OS) No. 30 12 430, a semiconductor component of this general type in the form of a MISFET is described in connection with FIG. 3 therein. It is a known problem with respect to MISFETs and other planar semiconductor components that the maximum reverse voltage depends upon the conditions at the surface of the semiconductor substrate in addition to the curvature of the space charge zone. Influences or effects on the upper surface are counteracted by different types of passivating films. The curvature i.e. the field strength gradient of the space charge zone may be influenced advantageously by specially formed field plates, by edge electrodes attached to the edge of the substrate and substantially at the substrate potential, and by protective rings disposed between the edge electrode and the planar zones. These measures are supposed to cause the equipotential lines to emerge to the outside through the substrate surface with a distribution which is as uniform as possible. This means that the surface field strength is equalized to the extent that it approaches the maximum reverse voltage possible by the interior material of the substrate.

It has been found, however, that the reverse voltage distribution is frequently unstable, which can be traced to an interaction of the freely mobile ions present in the passivating films with the protective ring or rings.

It is accordingly an object of the invention to provide a semiconductor component having a planar structure which is so improved over heretofore known semiconductor components of that general type that the field distribution at the surface of the substrate between the planar zones and the edge of the substrate remains largely stable.

With the foregoing and other objects in view, there is provided, in accordance with the invention, a planar semiconductor component having a substrate of one conduction type, a contacted zone of opposite conduction type embedded in the surface of the substrate in planar fashion and having a part thereof emerging to the surface, a control electrode covering that part of the contacted zone which emerges to the surface, an insulating layer on the surface, an edge electrode seated on the insulating layer at the edge of the substrate and electrically connected to the substrate, and at least one protective ring zone of the opposite conduction type disposed between the edge of the substrate and the contacted zone and embedded in planar fashion in the surface, including at least one conducting layer completely covering a part of the substrate emerging to the surface between the protective ring zone and the contacted zone, the conducting layer being electrically insulated from the emerging part of the substrate, and being electrically contacted by one of the contacted and protective ring zones embedded in planar fashion in the substrate surface.

In accordance with another feature of the invention, the conducting layer covering the emerging part of the substrate is a single conducting layer overlapping the protective ring zone embedded in planar fashion in the substrate surface, and being electrically insulated from the protective ring zone.

In accordance with a further feature of the invention, at least two of the conducting layers covering the emerging part of the substrate overlap and are electrically insulated from one another; at least one of the conducting layers being electrically contacted by one of the contacted and the protective ring zones embedded in planar fashion in the substrate surface, at least another of the conducting layers having an electric potential applicable thereto.

In accordance with an additional feature of the invention, the other conducting layer is formed by a gate electrode of a MISFET.

In accordance with an added feature of the invention, the other conducting layer is contacted by the other of the contacted and the protective ring zones embedded in planar fashion in the substrate surface.

In accordance with yet another feature of the invention, at least another protective ring zone of the opposite conduction type is embedded in the substrate surface in planar fashion between the edge electrode and the first-mentioned protective ring zone; and a further part of the substrate emerges to the surface between the first-mentioned and the other protective ring zones and is completely covered by at least one additional conducting layer, the additional conducting layer being contacted by the first-mentioned and the other protecting ring zones.

In accordance with yet a further feature of the invention, the further part of the substrate emerging to the surface between the protective ring zone is covered by two overlapping, conducting layers insulated from one another, one of the overlapping conducting layers being contacted by the first-mentioned protective ring zone and the other one of the overlapping, conducting layers by the other protective ring zone.

In accordance with yet an additional feature, the conducting layers respectively are connected to the protective ring zones and are connected, respectively, to a field plate overlapping the substrate on the side facing the edge electrode, the field plate of the first-mentioned protective ring zone being overlapped by yet electrically insulated from the conducting layer contacting the other protective ring zone.

In accordance with yet an added feature, the field plate of the protective ring zone adjacent to the edge electrode is overlapped by the edge electrode and is electrically insulated therefrom.

In accordance with an alternate feature of the invention, the conducting layers are formed of aluminum, and the field plates of doped polysilicon.

Other features which are considered as characteristic for the invention are set forth in the appended claims.

Although the invention is illustrated and described herein as embodied in semiconductor component with planar structure, it is nevertheless not intended to be limited to the details shown, since various modifications and structural changes may be made therein without departing from the spirit of the invention and within the scope and range of equivalents of the claims.

Figure 2:
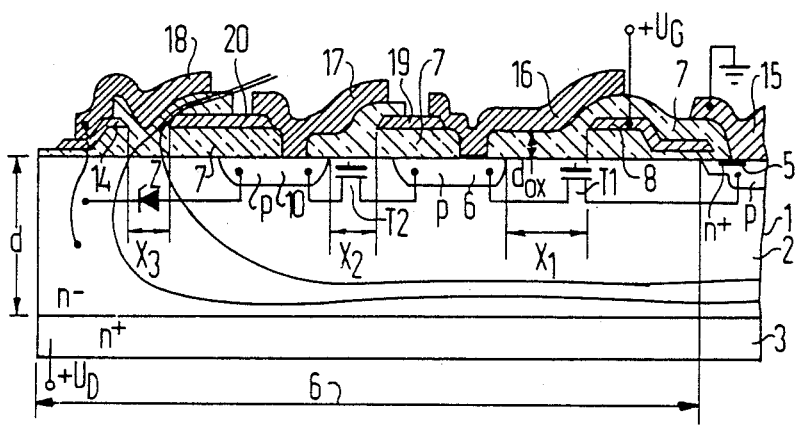
Figure 3:
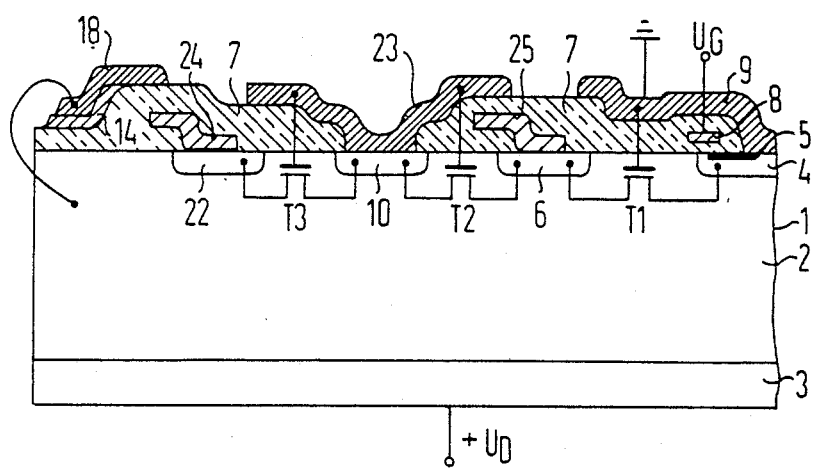

The construction and method of operation of the invention, however, together with additional objects and advantages thereof will be best understood from the following description of specific embodiments when read in connection with the accompanying drawings, in which:

FIGS. 1 to 3 are diagrammatic sectional views of semiconductor bodies of three different MISFETS wherein various different embodiments of the invention are incorporated.

Referring now to the drawing and first, particularly, to FIG. 1 thereof, there is shown an MIS semiconductor component having a substrate 1 formed of a heavily doped layer 3 and a relatively weakly doped layer 2 applied thereto, for example, by epitaxial deposition. The substrate 1 is of a given conduction type, namely, n-type in the embodiment of FIG. 1. In the one surface of the substrate 1, a zone 4 of opposite conduction type, namely p-type in the embodiment of FIG. 1, is embedded in planar fashion. This zone 4 is the channel zone of the MIS semiconductor component. A relatively highly doped zone 5 of the given conduction type i.e. n-type, is embedded in planar fashion in the channel zone 4. The zone 5 forms the source zone of the MIS semiconductor component. A multiplicity of cells formed of the zones 4 and 5 may also, for example, be arranged in a raster on the substrate. The illustrated cell 4, 5 then represents the cell adjacent to the edge of the substrate 1.

In the surface of the substrate 1, two protective rings 6, 10 of a conduction type, namely p-type in the illustrated embodiments opposite that of the substrate 1 are arranged between the cell 4, 5 and the edge of the substrate. The surface of the substrate 1 is covered by an insulating film 7 formed, for example, of $SiO_2$. In the insulating film 7, openings are formed through which the cell 4, 5 is contacted by a conducting layer 9 which is in turn connected to ground potential. The protective ring 6 is connected to a conducting layer 11, and the protective ring 10 by a conducting layer 12. The conducting layer 9 covers the part of the substrate 1 which emerges to the surface between the protective ring 6 and the channel zone 4 and is electrically insulated from this part. It may also overlap the protective ring 6. The conducting layer 9 also covers a gate electrode 8 which is provided for controlling the cell 4,5. The conducting layer 11 connected to the first protective ring 6 may overlap the second protective ring 10. The conducting layer 11 covers the part of the substrate 1 which emerges to the surface between the protective rings 10 and 6.

The conducting layers now shield the substrate surface against external freely mobile ions, so that the surface break-through voltage can no longer be influenced by them. The semiconductor component can then be viewed as if the first protective ring 6 were to form with the channel zone 4 a p-channel lateral FET, the gate electrode of which is the conducting layer 9 at source potential (ground potential). In the case at hand, the first protective zone 6 forms the source zone, and the channel zone 4 the drain zone of the p-channel lateral FET, which is identified in the figure by reference character T1. The gate electrode 8 provided for controlling the cell 4, 5 is likewise at ground potential when the MISFET is cut off, so that the conducting layer 9 and the gate electrode 8 can be considered as a common gate electrode for the FET T1. The second protective ring 10, together with the first protective ring 6 and the conducting layer 11, forms a second p-channel lateral FET T2. In complementary semiconductor components, the FETs T1 and T2 are n-channel FETs. Both transistors T1 and T2 are connected in series.

To explain the operation, it is assumed that a voltage $+U_D$ is applied to the electrodes of the MIS semiconductor component. Accordingly, a distribution of equipotential lines is formed which follows the illustrated course. At the surface of the substrate, a voltage is thereby formed, which acts as the drain-source voltage for the two series-connected lateral FETs T1 and T2. The part of the substrate between the second protective ring 10 and the edge of the substrate or the edge electrode 14 may be viewed as a Zener diode with a definite breakthrough voltage. The breakthrough voltage thereof is lower than the breakthrough voltage in the interior of the substrate. In the figure, this is symbolized by a Zener diode Z. The voltage difference between the voltage $+U_D$ and the voltage drop across the Zener diode Z is therefore present in the series circuit of the transistors T1 and T2. If the voltage drop across Z is 700 V, for example, and the voltage $+U_D$ is 1000 V, the series circuit of the lateral MISFETs must take up the difference of 300 V to prevent surface breakdowns.

That voltage which can be taken up by the p-channel lateral FETs is determined by the cut-off voltages thereof, because the conducting layers 9 and 11, respectively, acting as gate electrodes, are connected with the drain zone of the transistors T2 and T1. The cut-off voltage, in turn, may be determined by the thickness of the insulating film 7. The conducting layers 9, 11 and 12 may be formed of aluminum, for example. With a voltage $+U_D=1000$ V, a thickness of the insulating film 7 of $SiO_2$ between 2 and 3 $\mu$m, a doping of the zone 2 of from 40 to 50 ohm·cm and a thickness of 80 to 90 $\mu$m, a reverse voltage for each lateral MISFET of from 100 to 150 V is obtained. A distance of from 60 to 100 $\mu$m must then be provided between the edge of the substrate and the protective zone 10, for the above-indicated substrate doping, in order to be able to take up the residual voltage of from 700 to 800 V.

In FIG. 1, an MIS semiconductor component with two protective rings is shown. However, it is also possible to equip such a semiconductor component with only a single protective ring or with more than two protective rings and conducting layers. Just how many protective zones and conducting layers must be provided, depends on the requirement that the sum of the cut-off voltages of the lateral FETs and the breakthrough voltage of the edge "Zener diode" Z must be greater than the breakthough voltage in the substrate. The conducting layer 12 connected to the further protective ring adjacent the edge of the substrate overlaps the substrate in direction towards the edge and serves as a field plate. It may also be drawn out, as shown at 13, farther in direction towards the edge of the substrate and overlap the edge electrode 14.

In the embodiment of FIG. 1, the gate electrode of the lateral FETs are shorted to the respective drain zone thereof. However, it is also possible to construct the lateral FETs so that the gate electrode thereof are shorted to the corresponding source electrodes. Such an arrangement is shown in FIG. 2 wherein the first protective ring 6 is contacted by a conducting layer 16 which overlaps the gate electrode 8. A conducting layer 15 is contacted by the cell 4, 5 and, in turn, again overlaps the gate electrode 8 but is, however, insulated from the conducting layer 16. The second protective ring 10 is contacted by a conducting layer 17 which must overlap the first protective ring 6 in a case wherein it alone assumes the function of the gate electrode for the lateral FET formed by the protective rings 6 and 10. In this embodiment, the gate electrode for the aforementioned lateral FET is formed jointly by the conducting layer 17 and a field plate 19 connected to the conducting layer 16. The conducting layer 17 overlaps the field plate 19. Similarly, the gate electrode for the lateral FET T1 is formed by the gate electrode 8 and the conducting layer 16 overlapping the gate electrode 8. While the overlapping layers are at different potentials, this is immaterial if the gate potential, the material and the thickness of the insulator and the distance from the surface of the substrate are matched to one another. Likewise, the conducting layer 17 can be provided, on the side thereof facing towards the edge, with a field plate 20 overlapping the second protective ring 10 and the substrate. The field plates are preferably formed of doped polycrystalline silicon. By means of the field plates, an equalization of the surface field strength can be achieved.

If each of the lateral FETs is to have the same voltage drops, the lateral distances $X_1$, $X_2$ and $X_3$ between field plates and protective rings should decrease towards the edge. These distances $X_1$, $X_2$ and $X_3$, together with other parameters, determine the punch-through voltage drop of the lateral FET. It may be greater than the cut-off voltage in the construction according to FIG. 1, so that this solution permits more voltage drop per lateral FET.

If a reverse voltage is applied to the indicated direction, the difference between the voltage $+U_D$ and the voltage drop of the imaginary Zener diode considered to be connected between the edge and the second protective ring 10 drops again at T1 and T2. The voltages dropping at the lateral FETs can be adjusted by the thickness of the insulating layer, by the material of the insulating layer, by the thickness d and by the doping of the zone 2 as well as by the applied voltage $U_D$. The aforementioned distances $x_1$, $x_2$, $x_3$ are made, for example, 15, 10, 6 to 8 μm long. In general, they should be smaller or shorter by at least a factor of 10 than the oxide thickness.

In FIG. 3, an embodiment is shown which may be described as if the gate electrodes of the lateral FETs were partially shorted to the source zone and partially to the drain zone. The MISFET shown is expanded by a third protective ring 22. The second protective ring 10 is contacted by a conducting layer 23 which overlaps both the first protective ring 6 as well as the third protective ring 22. Two lateral FETs T3 and T2 are accordingly formed, the first lateral FET 1 corresponding to that of FIG. 1. The protective rings 6 and 22 may be connected to field plates 25 and 24, respectively, which are overlapped by the conducting layers 23 and the edge electrode 18, respectively.

The illustrated embodiments represent vertical MISFETs. The invention may also be used, however, for lateral MISFETs, for field-effect-controlled thyristors and triacs or generally for planar structures, including those of bipolar construction.

There are claimed:

1. Planar semiconductor component comprising a substrate of a first conduction type having a surface, a contacted zone of opposite conduction type planarly embedded in and emerging to the surface of the substrate and having a control electrode overlapping a part of the contacted zone, an insulating layer disposed on the surface, and at least two protective ring zones of the opposite conduction type disposed between the edge of the substrate and the contacted zone; at least two conducting layers, each contacting a respective one of said ring zones, said conducting layers being electrically insulated from said substrate and covering the part thereof that reaches the surface; at least one further conducting layer covering the substrate at the part thereof that reaches the surface between the contacted zone and the protective ring zone nearest the contacted zone; and wherein the distance between adjacent protective ring zones is less than the distance between the contacted zone and the protective ring zone nearest thereto; and wherein the distance from each protective ring zone, in direction toward the edge of the substrate, to the next protective ring zone is less than the distance to the nearest protective ring zone in direction toward the contacted zone.

2. Semiconductor component according to claim 1 wherein said contacted zone is contacted by a first one of said further conducting layers and wherein said first one of said further conducting layers covers the part of the substrate surface disposed between the contact zone and the protective ring zone nearest thereto.

3. MIS semiconductor component according to claim 2, wherein said conducting layers respectively connected to said protective ring zones and are connected, respectively, to a field plate overlapping the substrate on the side facing the edge electrode, the field plate of said first-mentioned protective ring zone being overlapped by and electrically insulated from the conducting layer contacting said other protective ring zone.

4. MIS semiconductor component according to claim 3, wherein the field plate of the protective ring zone adjacent to the edge electrode is overlapped by the edge electrode and is electrically insulated therefrom.

5. MIS semiconductor component according to claim 3 wherein said conducting layers are formed of aluminum, and said field plates of doped polysilicon.

6. Planar semiconductor component according to claim 1 wherein a second one of said further conducting layers is said control electrode, and wherein a first one of the further conducting layers is contacting said contacted zone and wherein the conducting layer that contacts the protective ring zone nearest the contacted zone jointly with the first one of the further conducting layers and with the control electrode cover that part of the substrate surface that is disposed between the contacted zone and the protective ring zone nearest the contacted zone.

7. Planar semiconductor component according to claim 1 further comprising an edge electrode electrically connected to the substrate.

8. Planar semiconductor component according to claim 2 wherein the conducting layers contacting the protective ring zones are mutually overlapping above the part of the substrate that emerges to the surface, said overlapping layers being electrically insulated from one another.

9. Planar semiconductor component according to claim 8 wherein at least one of said further conducting layers includes a field plate positioned where it overlaps another one of said conducting layers, and wherein said field plate is composed of an electrically conducting material being different from the material forming said further conducting layer.

10. Planar semiconductor component according to claim 7 wherein said edge electrode includes a conducting layer which overlaps the conducting layer that is contacting the protective ring nearest the edge of the substrate.

* * * * *